United States Patent
He et al.

(10) Patent No.: US 12,317,699 B2
(45) Date of Patent: May 27, 2025

(54) DISPLAY SUBSTRATES, DISPLAY PANELS AND DISPLAY SUBSTRATE MANUFACTURING METHODS

(71) Applicant: BOE Technology Group Co., Ltd., Beijing (CN)

(72) Inventors: Jiayu He, Beijing (CN); Ce Ning, Beijing (CN); Zhengliang Li, Beijing (CN); Hehe Hu, Beijing (CN); Jie Huang, Beijing (CN); Nianqi Yao, Beijing (CN)

(73) Assignee: BOE Technology Group Co., Ltd., Beijing (CN)

( * ) Notice: Subject to any disclaimer, the term of this patent is extended or adjusted under 35 U.S.C. 154(b) by 467 days.

(21) Appl. No.: 17/784,398

(22) PCT Filed: Jun. 3, 2021

(86) PCT No.: PCT/CN2021/098181
§ 371 (c)(1),
(2) Date: Jun. 10, 2022

(87) PCT Pub. No.: WO2021/254164
PCT Pub. Date: Dec. 23, 2021

(65) Prior Publication Data
US 2023/0122965 A1    Apr. 20, 2023

(30) Foreign Application Priority Data
Jun. 19, 2020    (CN) .................... 202010567724.X (51) Int. Cl.
*H10K 59/126*    (2023.01)
*H10D 86/01*    (2025.01)
(Continued)

(52) U.S. Cl.
CPC ......... *H10K 59/126* (2023.02); *H10D 86/021* (2025.01); *H10D 86/441* (2025.01);
(Continued)

(58) Field of Classification Search
CPC .. H10K 59/126; H10K 59/1213; H10K 59/13; H10K 59/131; H10K 71/60;
(Continued)

(56) References Cited

U.S. PATENT DOCUMENTS

2007/0257254 A1* 11/2007 Yang .................. H10K 59/13
257/40
2019/0027092 A1    1/2019 Matsueda
(Continued)

FOREIGN PATENT DOCUMENTS

CN    107464529 A    12/2017
CN    108615826 A    10/2018
(Continued)

OTHER PUBLICATIONS

PCT/CN2021/098181 international search report.
PCT/CN2021/098181 written opinion.

*Primary Examiner* — Syed I Gheyas
(74) *Attorney, Agent, or Firm* — IPro, PLLC (57) ABSTRACT

A display substrate includes: a base substrate; a metal light-shielding layer disposed on the base substrate; a plurality of pixel units disposed on the base substrate; a plurality of first thin film transistors disposed on the metal light-shielding layer and configured to drive the pixel units; a plurality of photodiodes disposed on the metal light-shielding layer and configured to convert light emitted from the pixel units into photocurrents, each of the photodiodes including a first electrode; a plurality of second thin film transistors disposed on the metal light-shielding layer (2, 2A) and configured to receive the photocurrents, so that light
(Continued)

emission of the pixel units are compensated according to the photocurrents. Output terminals of the first thin film transistors are electrically connected to the metal light-shielding layer, and a gate of the first thin film transistor is electrically connected to the first electrode. Further disclosed are a display panel and a display substrate manufacturing method.

14 Claims, 7 Drawing Sheets

(51) Int. Cl.
  *H10D 86/40*   (2025.01)
  *H10D 86/60*   (2025.01)
  *H10K 59/121*   (2023.01)
  *H10K 59/13*   (2023.01)
  *H10K 59/131*   (2023.01)
  *H10K 71/60*   (2023.01)

(52) U.S. Cl.
  CPC ......... *H10D 86/60* (2025.01); *H10K 59/1213* (2023.02); *H10K 59/13* (2023.02); *H10K 59/131* (2023.02); *H10K 71/60* (2023.02)

(58) Field of Classification Search
  CPC .... H10K 59/88; H10K 59/123; H01L 27/124; H01L 27/1259; H01L 29/78633; H01L 27/1214
  See application file for complete search history.

(56) References Cited

U.S. PATENT DOCUMENTS

2020/0044004 A1*   2/2020   Wang ................ H10K 50/828
2020/0273933 A1    8/2020   Xu et al.

FOREIGN PATENT DOCUMENTS

CN    109065582 A    12/2018
CN    111599825 A    8/2020

* cited by examiner

DISPLAY SUBSTRATES, DISPLAY PANELS AND DISPLAY SUBSTRATE MANUFACTURING METHODS

The present disclosure is the U.S. national phase of PCT Application No. PCT/CN2021/098181 filed on Jun. 3, 2021, which claims priority to the Chinese Patent Application No. 202010567724.X, entitled "Display Substrate, Display Panel, and Display Substrate Manufacturing Method", filed with the Chinese Patent Office on Jun. 19, 2020, Application, which is incorporated herein by reference in its entirety.

TECHNICAL FIELD

Embodiments of the present disclosure relate to display substrates, display panels and methods for manufacturing the display substrates.

BACKGROUND

Since OLED (Organic Light-Emitting Diode) display technology has advantages of low power consumption, fast response, wide viewing angle, thin thickness, realizable flexibility and the like, OLED display has been used widely presently. To improve display effects of the OLED display panel, the OLED display panel needs to be compensated according to display states. A common compensation method is electrical compensation, but electrical compensation has very limited effects and further improvement in display effects is difficult to achieve.

SUMMARY

At least one embodiment of the present disclosure provides a display substrate comprising: a base substrate; a metal light-shielding layer disposed on the base substrate; a plurality of pixel units disposed on the base substrate; a plurality of first thin film transistors disposed on the metal light-shielding layer and configured to drive the pixel units; a plurality of photodiodes disposed on the metal light-shielding layer and configured to convert light emitted from the pixel units into photocurrents; and a plurality of second thin film transistors disposed on the metal light-shielding layer and configured to receive the photocurrents so that light emission of the pixel units are compensated according to the photocurrents; where output terminals of the first thin film transistors are electrically connected to the metal light-shielding layer, and a gate of the first thin film transistor is electrically connected to the first electrode.

In some embodiments of the present disclosure, the first thin film transistors and the second thin film transistors are disposed in a same layer and are all top gate structures, and the photodiodes are located above the second thin film transistors.

In some embodiments of the present disclosure, the photodiodes are located over the first thin film transistors and the second thin film transistors, and each comprises a first electrode, a second electrode, and a photosensitive layer disposed between the first electrode and the second electrode, the first electrode is electrically connected to gates of one or more of the first thin film transistors and the second electrode is electrically connected to one or more of the second thin film transistors.

In some embodiments of the present disclosure, the display substrate comprises a plurality of the pixel units disposed along a column direction and a plurality of pixel circuit regions disposed along the column direction, each of the pixel units is located between a corresponding pixel circuit region and a corresponding photodiode, and the first thin film transistors are at least partially located in the pixel circuit regions.

In some embodiments of the present disclosure, the display substrate comprises a plurality of the pixel units disposed along a column direction, each of the photodiodes is located between two adjacent pixel units of the pixel units and is configured to detect a luminous intensity of the two adjacent pixel units.

In some embodiments of the present disclosure, the display substrate comprises one or more dummy detection areas each located between two photodiodes adjacently disposed along a row direction.

In some embodiments of the present disclosure, each of the pixel units comprises a plurality of sub-pixel units, each of the plurality of sub-pixel units emitting light with a color different from that of others of the plurality of sub-pixel units.

In some embodiments of the present disclosure, the display substrate further comprises a detection signal line, a plurality of data signal lines and a plurality of third thin film transistors, wherein the data signal lines are respectively electrically connected to an input terminal of a corresponding one of the third thin film transistors, and for each of the first thin film transistors, a gate of the first thin film transistor is electrically connected to an output terminal of a corresponding third thin film transistor; and the detection signal line is electrically connected to output terminals of the second thin film transistors, and the second electrode is electrically connected to input terminals of the plurality of second thin film transistors.

In some embodiments of the present disclosure, the detection signal line and the data signal lines are arranged along a column direction, and the pixel units are at least partially located between the detection signal line and the data signal lines.

At least embodiment of the present disclosure further provides a display panel comprising the display substrate as described above.

At least embodiment of the present disclosure further provides a method for manufacturing a display substrate, comprising: providing a base substrate; forming a metal light-shielding layer on the base substrate; forming a plurality of first thin film transistors and a plurality of second thin film transistors on the metal light-shielding layer, output terminals of the first thin film transistors being electrically connected to the metal light-shielding layer; forming a plurality of photodiode on the second thin film transistors; and forming an insulating cover layer over the photodiodes.

In some embodiments of the present disclosure, the method further comprises the method further comprises annealing the insulating cover layer.

In some embodiments of the present disclosure, the method further comprises forming a plurality of pixel electrodes on the insulating cover layer, the pixel electrodes being electrically connected to the output terminals of the first thin film transistors.

In some embodiments of the present disclosure, the photodiodes each comprise a first electrode, a second electrode and a photosensitive layer disposed between the first and second electrodes, the first electrode is electrically connected to gates of one or more of the first thin film transistors and the second electrode is electrically connected to one or more of the second thin film transistors to transmit a photocurrent generated by the photodiode to the one or more second thin film transistors.

Since the first electrode of the photodiode is electrically connected to the gate of the first thin film transistor, and the metal light-shielding layer is electrically connected to the source of the first thin film transistor, different voltages between the upper and lower layers of the double-gate structure are achieved, and the influence of hydrogen on the lower channel region is advantageously reduced, so that characteristics of the second thin film transistor with the double-gate structure are kept normal, and a array backplate having better characteristics can be manufactured.

DETAILED DESCRIPTION OF THE EMBODIMENTS

Reference will be made herein in detail to exemplary embodiments, examples of which are illustrated in the accompanying drawings. When the following description refers to the accompanying drawings, the same numbers in different drawings represent the same or similar elements unless otherwise represented. The embodiments described in the following exemplary embodiments do not represent all embodiments consistent with the present disclosure. Instead, they are merely examples of devices consistent with some aspects of the present disclosure as detailed in the appended claims.

The terminology used herein is for the purpose of describing particular embodiments only and is not intended to limit the present disclosure. Unless defined otherwise, technical or scientific terms used herein have the same meaning as is commonly understood by those skilled in the art to which the present disclosure belongs. The terms "first", "second", and the like used in the description and the claims of the present disclosure do not denote any order, quantity, or importance, but rather are used to distinguish one element from another. Also, the terms of "a", "an" or the like does not denote a limitation of quantity, but rather denotes the presence of at least one. The term "plurality" or "several" means two or more. Unless otherwise noted, the terms such as "front", "back", "lower" and/or "upper" are used merely for convenience of description and are not limited to a single position or spatial orientation. The term "including", "comprising" or the like indicates that elements or articles preceding "comprising" or "comprises" encompass elements or articles listed thereafter and equivalents thereof and not exclusive of other elements or articles. The term "connected", "coupled" or the like is not restricted to physical or mechanical connections, and may include electrical connections, regardless of direct or indirect connections. As used in the description and the appended claims of the present disclosure, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

In the OLED display panel in the related art, to improve display effect of the OLED display panel, compensation for the OLED display panel is performed according to display states. A common compensation method is electrical compensation, but effect of electrical compensation is very limited and further improvement in display effect is difficult to achieve.

At least one embodiment of the present disclosure provides an optical compensation method where by providing a photodiode to sense a luminous intensity of an OLED display panel, and feeding back a signal detected by the photodiode to a driving chip of the OLED display panel, the driving chip controls a driving voltage to perform compensation according to the luminous intensity of the OLED display panel. During a process for manufacturing the photodiode, to ensure film quality and thickness of a photosensitive layer, generally, it takes 10 to 30 minutes to deposit the photosensitive layer and gases for deposition are mainly $SiH_4$ and $H_2$. However, during depositing for 10 to 30 minutes in a hydrogen atmosphere, metal oxide semiconductor tends to transform into conductor such that semiconductor layers of the thin film transistors are oxidized, resulting in the thin film transistors substantially in a high current state. It is difficult for the thin film transistors to return to their original states in subsequent processes, affecting the performance of the thin film transistors.

Figure 1:
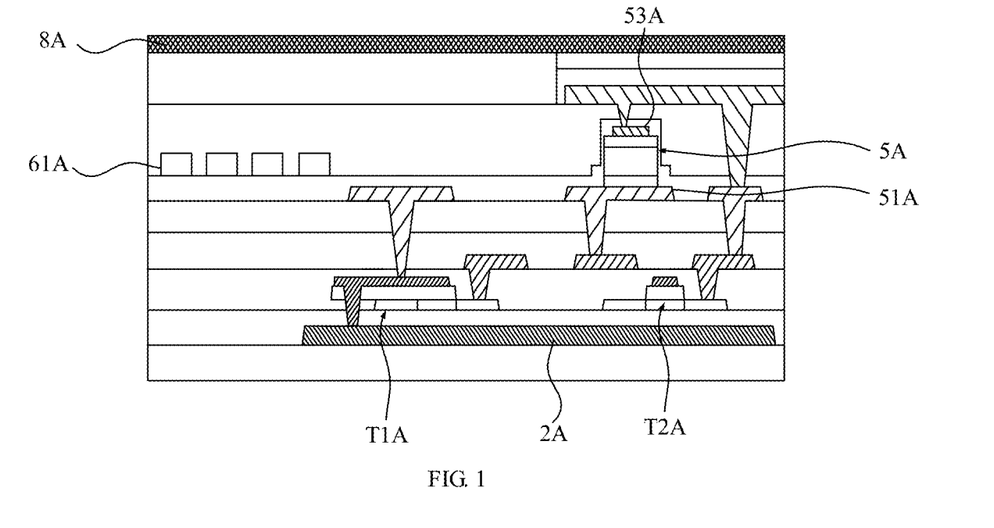
FIG. 1 shows a schematic cross-sectional view of a display substrate in the related art, where only one unit of the display substrate is illustrated.
Figure 2:
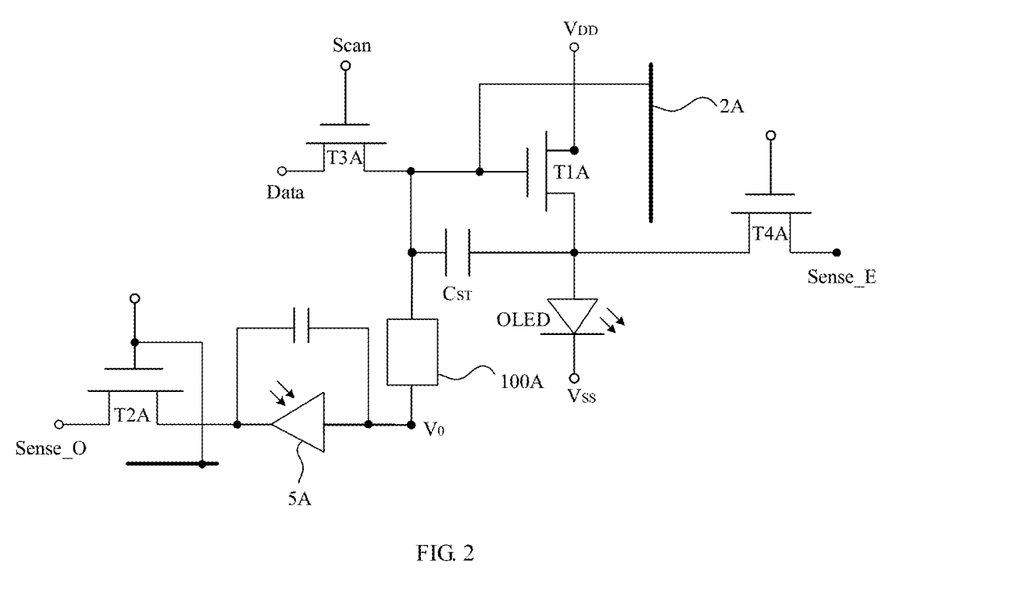
FIG. 2 shows a schematic diagram of a driving circuit of the display substrate shown in FIG. 1.

FIG. 1 and FIG. 2 respectively show a cross-sectional view and a driving circuit diagram of an OLED display panel, in which a first thin film transistor T1A serves as a drive TFT of the OLED, a third thin film transistor T3A serves as a switch TFT, a second thin film transistor T2A is configured to receive a photocurrent generated by a photodiode 5A and transmit the photocurrent to a driving chip (not shown) through a sense signal line Sense_O, and a fourth thin film transistor T4A is configured to perform electrical compensation. In an embodiment of the present disclosure, an input terminal of the third thin film transistor T3A is electrically connected to a Data line, an output terminal of the third thin film transistor T3A is electrically connected to a gate of the first thin film transistor T1A, a gate of the third thin film transistor is electrically connected to a Scan line; an output terminal of the first thin film transistor T1A is electrically connected to a pixel electrode 61A (an OLED pixel in FIG. 2 comprises a pixel electrode, a light-emitting structure and a common electrode), an input terminal of the first thin film transistor T1A is electrically connected to a power positive electrode $V_{DD}$, a common electrode 8A is electrically connected to a power negative electrode $V_{SS}$, $C_{ST}$ is a storage capacitor configured to store charges; a lower electrode 51A of the photodiode 5A is electrically connected to the gate of the first thin film transistor T1A through a line $V_0$ and a bridge circuit 100A, an upper electrode 53A of the photodiode 5A is electrically connected to an input terminal of the second thin film transistor T2A, an output terminal of the second thin film transistor T4 is connected to the sense signal line Sense_O to transmit the photocurrent generated by the photodiode 5A to the driving chip; a metal light-shielding layer 2A is electrically connected to the gate of the first thin film transistor T1A; an input terminal of the fourth thin film transistor T4A is connected to an electrical compensation line Sense_E and thus an electrical compensation circuit, an output terminal of the fourth thin film transistor T4A is electrically connected to the output terminal of the first thin film transistor T1A. A solid dot in the figure indicates that two intersecting traces are electrically connected, and if there is no black dot at an intersection of two intersecting traces, it indicates no electrical connection therebetween.

The metal light-shielding layer 2A and the gate of the first thin film transistor T1A form an upper and lower double-gate structure, which can become floating under source-drain voltages by coupling. In addition, in the double-gate TFT structure, an upper channel voltage is driven by the gate of the first TFT T1A with a voltage having a relatively constant value, and a lower channel voltage is driven by the input terminal and the output terminal of the first TFT T1A with a driving voltage being relatively small. During a process for manufacturing the photodiode 5A, hydrogen intrudes into the underlying first thin film transistor T1A, causing carriers in the channel to increase, thereby negatively biasing the TFT characteristics to be conductive and exhibiting a large current state, affecting performances of the OLED display panel.

At least one embodiment of the present disclosure provides a display substrate including a base substrate; a metal light-shielding layer disposed on the base substrate; a plurality of pixel units disposed on the base substrate; first thin film transistors disposed on the metal light-shielding layer and configured to drive the pixel units; a plurality of photodiodes disposed on the metal light-shielding layer and configured to convert light emitted from the pixel units into photocurrents; and second thin film transistors disposed on the metal light-shielding layer and configured to receive the photocurrents so as to perform compensation for light emission from the pixel units according to the photocurrents; where output terminals of the first thin film transistors are electrically connected to the metal light-shielding layer, and gates of the first thin film transistors are electrically connected to the first electrodes.

Figure 3:
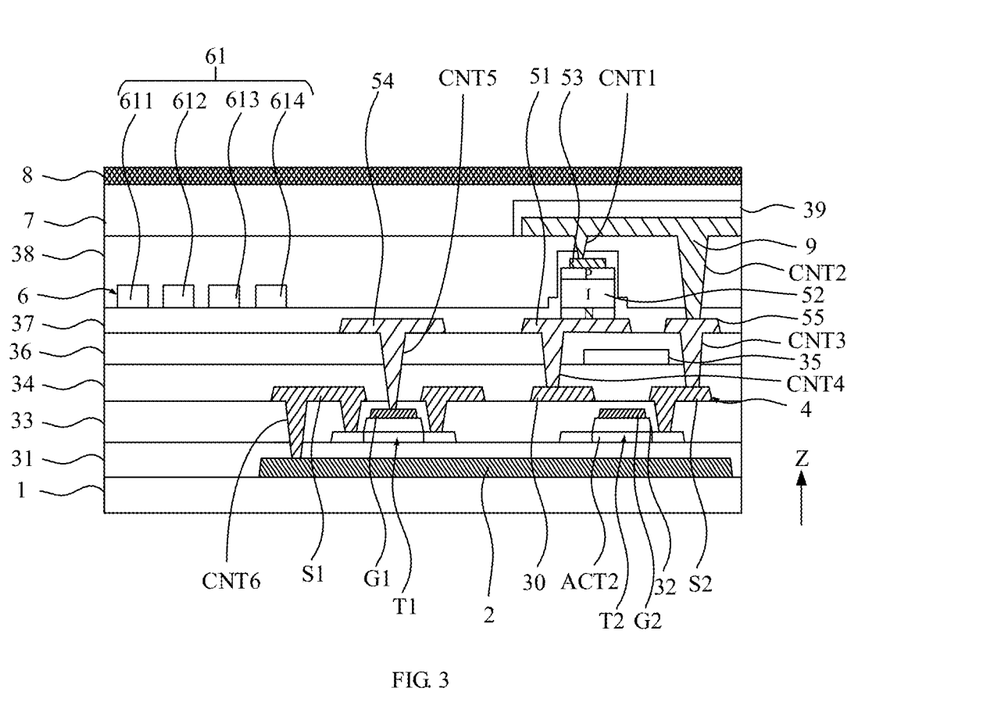
FIG. 3 is a schematic cross-sectional view of a display substrate according to an embodiment of the present disclosure, where only one unit of the display substrate is illustrated.
Figure 4:
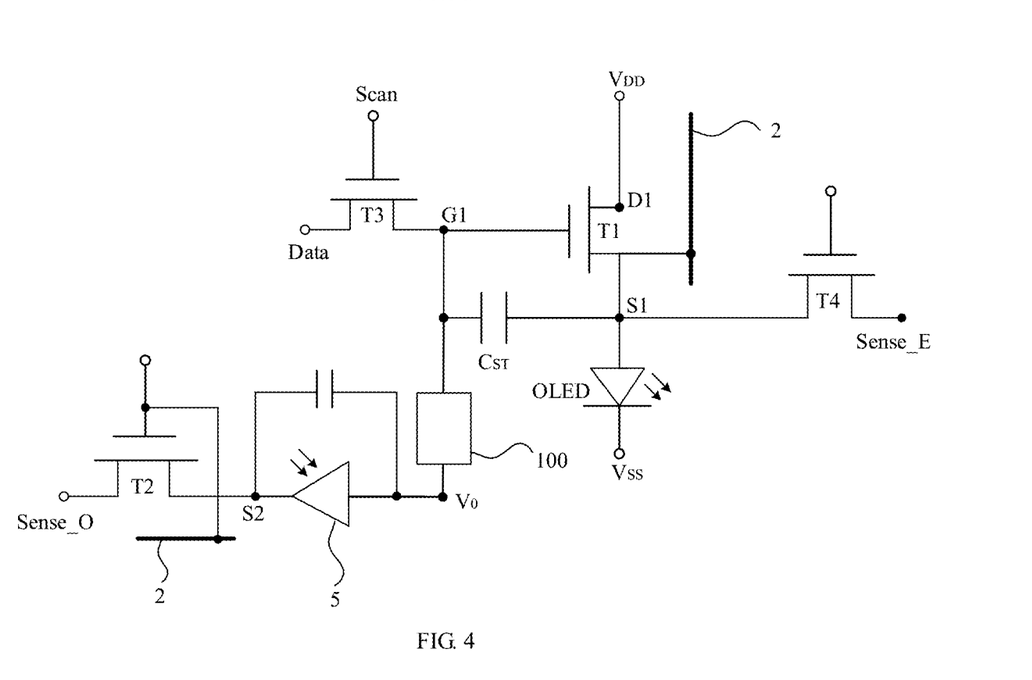
FIG. 4 is a schematic diagram of a driving circuit of the display substrate shown in FIG. 3.
Figure 5:
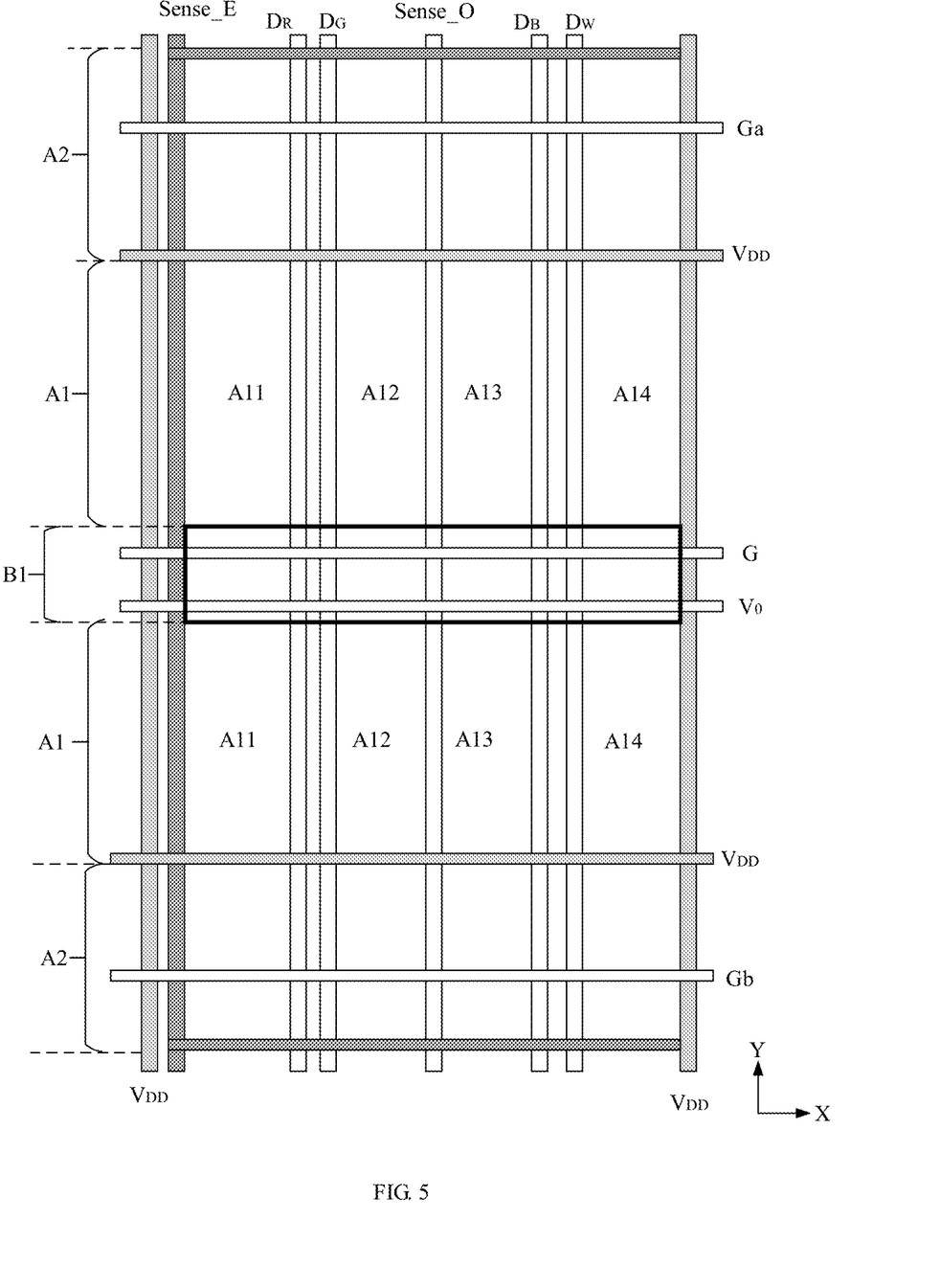
FIG. 5 is a schematic front view of traces of the display substrate shown in FIG. 3.

Referring to FIGS. 3 to 5, in an embodiment of the present disclosure, the display substrate, for example, an OLED display panel, includes a base substrate 1, a metal light-shielding layer 2 formed on the base substrate 1, a thin film transistor layer 4, a photodiode 5, a pixel electrode layer 6, an organic light emitting layer 7, and a common electrode 8. As shown in FIG. 3, a direction from the base substrate 1 to the metal light-shielding layer 2 is an upward direction, a direction from the metal light-shielding layer 2 to the base substrate 1 is a downward direction, and the upward direction is parallel to a vertical direction Z. In an embodiment of the present disclosure, the pixel electrode layer 6 is an anode layer, the common electrode 8 is a cathode, and the common electrode may be a planar electrode (that is, the entire electrode as a whole) or may comprise a plurality of sub-electrodes with potentials equal to each other.

The thin film transistor layer includes first thin film transistors T1 and second thin film transistors T2, that is, the first thin film transistors T1 and the second thin film transistors T2 are disposed in the same layer (it can be understood that same film layers of the first thin film transistors T1 and the second thin film transistors, for example, gates G1 of the first thin film transistors T1 and gates G2 of the second thin film transistors T2, are formed in the same patterning process). The first thin film transistor T1 serves as a drive TFT for the pixel electrode 61 of the pixel electrode layer 6. The second thin film transistor T2 receives and reads an electrical signal generated by the photodiode 5. Of course, the display substrate further includes third thin film transistors T3 and fourth thin film transistors T4. The third thin film transistor T3 serves as a switch TFT for the pixel electrode 61, the fourth thin film transistor T4 is used for electrical compensation, and an electrical compensation line Sense_E (Sense Electric) may be electrically connected to an input terminal, such as a drain, of the fourth thin film transistor T4. The metal light-shielding layer 2 is disposed between the base substrate 1 and the thin film transistor layer 4, and is configured to shield a lower side of the thin film transistor layer to prevent ambient light from entering the thin film transistor layer 4 of the display substrate and affecting the performance of each thin film transistor, for example, to prevent ambient light from directly illuminating the second thin film transistor T2 and resulting in abnormal photodetection data or device degradation when exposed to light. The light shielding layer may be a unitary body or may comprise a plurality of spaced-apart light shielding units, and the structure of the light-shielding layer may be selected as per actual conditions. It should be noted that FIG. 3 schematically illustrates the electrical connections of the conductive elements and does not indicate actual locations of certain elements, such as the first thin film transistor T1.

Of course, insulating layers are provided between conductive films to achieve electrical isolation, such as a buffer layer 31 provided between the metal light-shielding layer 2 and the thin film transistor layer 4, a gate insulating layer 32 provided between an active layer (e. g., the active layer ACT2 of the second thin film transistor T2) and a gate (e. g., the gate G2) of the thin film transistor, a dielectric layer 33 provided between the gate (e. g., the gate G1) and the source and drain electrodes (e. g., the source S1) of the thin film transistor, a first insulating layer 34 provided on the thin film transistor layer, an SOG (silicone resin) layer 35 provided on the first insulating layer 34, a second insulating layer 36 provided between the SOG layer 35 and the photodiode 5, a third insulating layer 37 provided between the photodiode 5 and the pixel electrode layer 6, a fourth insulating layer 38 provided between the pixel electrode layer 6 and the first bridge electrode 9, and a pixel defining layer 39 provided between the fourth insulating layer 38 and the common electrode 8.

The SOG layer 35 is located between the second thin film transistor T2 and the photodiode 5 and may be used to reduce or eliminate capacitance of parasitic capacitor formed between (the first electrode of) the photodiode and the second thin film transistor. The third insulating layer 37 also serves as an insulating cover layer for the photodiode 5, which functionally encapsulates the photodiode 5, and may reduce or even prevent water and oxygen from entering the photodiode 5. After the third insulating layer 37 is deposited, the third insulating layer 37 may optionally be annealed to replenish the first thin film transistor T1, the second thin film transistor T2, and the third thin film transistor T3 with oxygen, which may combine with hydrogen entering each thin film transistor when forming the photosensitive layer to form water vapor and overflow, thereby reducing the influence of hydrogen on each thin film transistor. The display substrate includes a plurality of pixel units A1, and the pixel defining layer 39 is configured to define the pixel units A1.

The pixel electrode layer 6 includes a plurality of pixel electrodes 61, and in an embodiment of the present disclosure, each pixel electrode 61 corresponds to one pixel unit A1, and the pixel units A1 are arranged in a plurality of rows and a plurality of columns, where a row direction is the X direction, and a column direction is the Y direction. In an embodiment of the present disclosure, the pixel electrode 61 includes a plurality of sub-electrodes, that is, a first sub-electrode 611 (corresponding to R, Red), a second sub-electrode 612 (corresponding to G, Green), a third sub-electrode 613 (corresponding to B, Blue) and a fourth sub-electrode 614 (corresponding to W, White), each of which corresponds to one first thin film transistor T1 and one third thin film transistor T3. That is, each pixel unit includes four pixel sub-electrodes, four first thin film transistors T1 and four third thin film transistors T3. In an embodiment of the present disclosure, the pixel electrode 61 may include only one sub-electrode.

The photodiode 5 includes a first electrode 51, a photosensitive layer 52, and a second electrode 53 arranged sequentially along a vertical direction Z. The photosensitive layer 52 includes an N-type semiconductor, an I-type semiconductor (intrinsic semiconductor) and a P-type semiconductor disposed sequentially along the vertical direction Z. In the absence of light, the photodiode 5 is in an off state under a reverse voltage, and a dark current passing through the photodiode 5 is small; when exposed to light, the reverse current increases rapidly, referred to as photocurrent, and the greater the intensity of the light, the greater the photocurrent. The display substrate further includes a first bridge electrode 9 disposed on the fourth insulating layer 38 and a third bridge electrode 55 disposed in the same layer as the first electrode 51. The first bridge electrode 9 and the third bridge electrode 55 are configured to electrically connect the second electrode 53 to the input terminal S2 of the second thin film transistor T2, such as a source, and the output terminal (such as a drain) of the second thin film transistor T2 is electrically connected to a sense signal line Sense_O (Sense Optical), so as to transmit an electrical signal converted from a light signal to a driving chip of the display substrate, and the driving chip determines a compensation factor according to the received electrical signal, and performs compensation for brightness by adjusting the driving voltage of the pixel electrode 61, that is, performs optical compensation. In some embodiments of the present disclosure, the third bridge electrode may not be provided, that is, the first bridge electrode 9 is directly electrically connected to the source S2 of the second thin film transistor T2.

In an embodiment of the present disclosure, the second electrode 53 is electrically connected to the first bridge electrode 9 through a first via CNT1, the first bridge electrode 9 is electrically connected to the third bridge electrode 55 through a second via CNT2, and the third bridge electrode 55 is electrically connected to the input terminal S2 of the second thin film transistor T2 through a third via CNT3. The term "electrical connection" should be understood as: it can be a direct contact electrical connection or an indirect electrical connection (that is, other circuits or electronic elements are provided between the two electrically connected). The first via CNT1 extends through the fourth insulating layer 38 and the third insulating layer 37, the second via CNT2 extends through the fourth insulating layer 38 and the third insulating layer 37, and the third via CNT3 extends through the second insulating layer 36 and the first insulating layer 34.

The display substrate further includes a second bridge electrode 30 disposed in the same layer as the input terminal S2 of the second thin film transistor T2, the first electrode 51 of the photodiode 5 is electrically connected to the second bridge electrode 30 through a fourth via CNT4 extending through the second insulating layer 36 and the first insulating layer 34. The second bridge electrode 30 may be electrically connected to the output voltage line $V_O$ which may be electrically connected to the gate G1 of the first thin film transistor T1 through a bridge circuit 100. The bridge circuit may be understood as a circuit including electronic elements and may output another voltage after receiving the sensed voltage of the photodiode. For example, a bridge circuit includes a driving chip (which is electrically connected to the sense signal line Sense_O at the same time, not shown in FIG. 4). In an embodiment of the present disclosure, the display substrate further includes a fourth bridge electrode 54 through which the bridge circuit 100 is connected to the gate G1 of the first thin film transistor T1 (or a gate line electrically connected to the gate G1). For example, the fourth bridge electrode 54 is connected to the gate G1 of the first thin film transistor T1 through a fifth via CNT5 extending through the second insulating layer 36, the first insulating layer 34 and the dielectric layer 33. The output terminal S1 of the first thin film transistor T1 is electrically connected to the metal light-shielding layer 2 through a sixth via CNT6 penetrating through the dielectric layer 33 and the buffer layer 31 for grounding. In some embodiments of the present disclosure, the first electrode 51 and the fourth bridge electrode 54 may form a unitary structure, that is, the two combined may be regarded as an integral "first electrode", and the integral "first electrode" is directly electrically connected to the gate G1 of the first thin film transistor T1, without providing a structure such as a bridge electrode, a bridge circuit, or the like. However, it is noted that the unitary design of both should not affect the layout of other elements.

Description below will be made in combination with the circuit diagram. With reference to FIG. 3 to FIG. 5, in which the first thin film transistor T1 serves as a drive TFT of the OLED, the third thin film transistor T3 serves as a switch TFT, the second thin film transistor T2 is configured to receive a photocurrent generated by the photodiode 5 and transmit the photocurrent to the driving chip (not shown) via a sense signal line Sense_O, and the fourth thin film transistor T4 is configured to perform electrical compensation. For example, the input terminal of the third thin film transistor T3 is electrically connected to a data line (data signal line), the output terminal of the third thin film transistor T3 is electrically connected to the gate G1 of the first thin film transistor T1, and the gate of the third thin film transistor T3 is electrically connected to a Scan line; the output terminal S1 of the first thin film transistor T1 is electrically connected to a pixel electrode of the OLED (the OLED in FIG. 4 refers to a device formed by pixel electrodes, an organic light emitting layer, and a common electrode), the input terminal D1 of the first thin film transistor T1 is electrically connected to a power positive line $V_{DD}$, the common electrode of the OLED is electrically connected to a power negative line $V_{SS}$, a storage capacitor $C_{ST}$ is formed between the pixel electrode of the OLED and the gate G1 of the first thin film transistor T1 (or other structure with a potential equal to that of the gate G1), and the storage capacitor $C_{ST}$ is configured to store charges; a first electrode 51 of the photodiode 5 is electrically connected to the gate G1 of the first thin film transistor T1 through a line $V_O$ and the bridge circuit 100, a second electrode 53 of the photodiode 5 is electrically connected to the input terminal S2 of the second thin film transistor T2, the output terminal of the second thin film transistor T2 is electrically connected to the sense signal line Sense_O; the metal light-shielding layer 2 is electrically connected to the output terminal S1 of the first thin film transistor T1; the input terminal of the fourth thin film transistor T4 is electrically connected to the electrical compensation line Sense_E and thus the electrical compensation circuit, and the output terminal of the fourth thin film transistor T4 is electrically connected with the output terminal S1 of the first thin film transistor T1.

In some embodiments of the present disclosure, the first thin film transistor T1 and the second thin film transistor T2 are formed as a top gate structure. The metal light-shielding layer 2 and the gate G1 of the first thin film transistor T1 form an upper and lower double-gate structure in which, in operation, carriers are attracted or repelled by electric field generated by the upper and lower gates and do not accumulate at an interface of an active layer but tend to be distributed more evenly. Thus, electrical properties of the double-gate TFT, such as on-state current, off-state current, threshold voltage, etc., are less affected by the interface of the active layer as compared to a single-gate TFT. In general, an internal portion of the active layer has less defects compared to its interface, with a uniformity more easily to be controlled, and is less susceptible to the environment and subsequent processes. Since the first electrode 51 of the photodiode 5 is electrically connected to the gate G1 of the first thin film transistor T1, and the metal light-shielding layer (usually connected to ground) 2 is electrically connected to the output terminal S1 of the first thin film transistor, the metal light-shielding layer 2 has a voltage (or a potential, similarly hereinafter) of 0, and the gate G1 of the first thin film transistor T1 has a voltage not equal to 0. The voltage of the metal light-shielding layer 2 is not equal to the voltage of the gate G1 of the first thin film transistor T1, and different voltages in the upper and lower layers of the double-gate structure is achieved, and the influence of hydrogen on the underlying channel region is advantageously reduced, and the double gate is prevented from floating under the source and drain voltages, so that characteristics of the second thin film transistor of the double-gate structure is maintained normal, and thus the display substrate has better characteristics.

The traces of the display substrate include a power positive line $V_{DD}$, data signal lines $D_R$, $D_G$, $D_B$, $D_W$ (i.e., the data line shown in FIG. 4), a sense signal line Sense_O, an electrical compensation line Sense_E, first scan lines Ga, Gb (corresponding to the Scan line shown in FIG. 4), a second scan line G, and a voltage output line $V_O$ (having a potential equal to that of the first electrode 51). Where the data signal lines $D_R$, $D_G$, $D_B$, $D_W$, and the sense signal line Sense_O extend along the column direction Y, the first scan lines Ga, Gb, the second scan lines G and the voltage output line $V_O$ extend along the row direction X, the power positive line $V_{DD}$ and the electrical compensation line Sense_E each comprise two portions separately extending along the row direction X and extending along the column direction Y. The first scan lines Ga and Gb respectively correspond to two pixel units A1 disposed adjacent to each other along the column direction Y and are electrically connected to the gate of the corresponding third thin film transistor T3, and the second scan line G is electrically connected to the gate G2 of the second thin film transistor T2. The power positive lines $V_{DD}$ are configured to provide power voltages; the data signal lines $D_R$, $D_G$, $D_B$, $D_W$ are respectively electrically connected to the input terminal of the corresponding third thin film transistor T3; the sense signal line Sense_O is electrically connected to the driving chip; and the electrical compensation line Sense_E is configured to be connected to the electrical compensation circuit.

Figure 6:
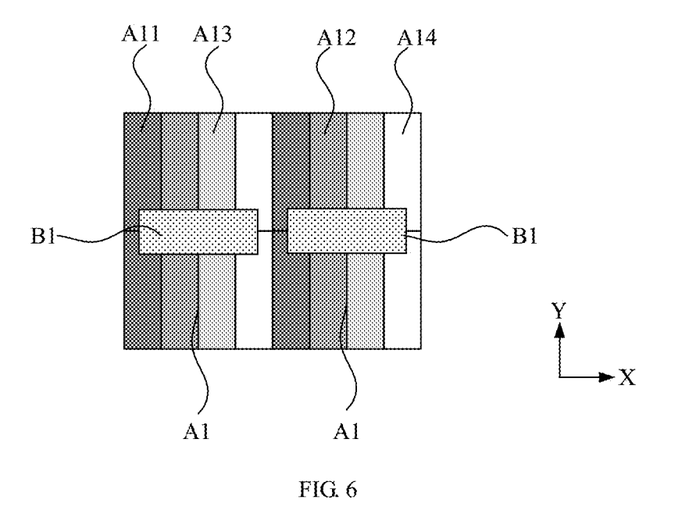
FIG. 6 is a schematic front view of two pixel units of a display substrate according to another embodiment of the present disclosure.
Figure 7:
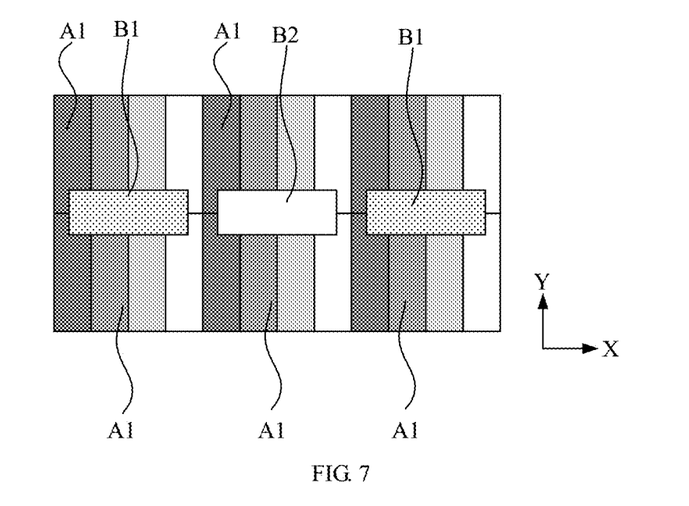
FIG. 7 is a schematic front view of three pixel units of a display substrate according to yet another embodiment of the present disclosure.

Referring to FIG. 5 to FIG. 7, the display substrate further includes a plurality of pixel circuit regions A2 and a plurality of photoelectric detection regions B, the pixel circuit regions A2 are configured to provide circuitry for driving pixel electrodes, and the photodiodes 5 are disposed in the photoelectric detection regions B1. The pixel units A1 are disposed between the pixel circuit regions A2 and the photoelectric detection regions B1. The first thin film transistor T1 (FIG. 3 merely illustrates the electrical connection relationship and the actual position of the first thin film transistor T1 may be different) and the third thin film transistor T3 are at least partially located in the pixel circuit region A2. With such a configuration, the photodiode 5 is provided away from electronic elements such as the first thin film transistor T1 and the third thin film transistor T3, and when fabricating the photodiode 5, amount of hydrogen entering the first thin film transistor T1 and the third thin film transistor T3 can be significantly reduced. In addition, the photodiode 5 is spaced away from the pixel circuit region A2, so as to prevent signal interference between the photodiode 5 and the devices of the pixel circuit region A2.

The pixel unit A1 includes a plurality of sub-pixel units, namely a first sub-pixel unit A11 (corresponding to R), a second sub-pixel unit A12 (corresponding to G), a third sub-pixel unit A13 (corresponding to B), and a fourth sub-pixel unit A14 (corresponding to W), at least one sub-pixel unit is disposed between the detection signal line Sense_O and the data signal line (e.g. the data signal line $D_R$, $D_G$, $D_B$, $D_W$), for example, the second sub-pixel unit A12 is disposed between the data signal line $D_R$ (or $D_G$) and the sense signal line Sense_O. That is, the sense signal line Sense_O and the electrical compensation line Sense_E may be disposed away from the data signal lines $D_R$, $D_G$, $D_B$, $D_W$, so as to prevent interference between the sense signal line Sense_O, the electrical compensation line Sense_E and each of the data signal lines. In some embodiments of the present disclosure, the pixel unit A1 includes only one sub-pixel unit and is totally located between the sense signal line and the data signal line.

The photoelectric detection region B1 (or the photodiode 5) is located between two pixel units A1 adjacent to each other along the column direction Y, and the photodiode 5 disposed in the photoelectric detection region B1 is configured to detect the luminous intensity of the two pixel units A1, convert the light signal into an electrical signal and then transmit the electrical signal to the driving chip to adjust the driving voltages of the pixel electrodes for optical compensation. In some embodiments of the present disclosure, the photodiode 5 may be configured to detect the luminous intensity of a single pixel cell A1.

The distance between the first scan line Ga and the second scan line G in the column direction Y is 140~170 μm, and the distance between the first scan line Gb and the second scan line G in the column direction Y is 140~170 μm. The photoelectric detection region B1 has a substantially rectangular shape with a dimension in the row direction X of 270~300 μm and a dimension in the column direction of 70~80 μm. Preferably, to arrange the photoelectric detection region B1 away from the pixel circuit region A2, so as to reduce the hydrogen entering the first thin film transistor T1 and the third thin film transistor T3 and reduce the influence of the photodiode on the light emitting area while forming a photosensitive layer, the distance between the first scan line Ga and the second scan line G in the column direction Y is 150~160 μm, and the distance between the first scan line Gb and the second scan line G in the column direction Y is 150~160 μm. A dimension of the photoelectric detection region B1 in the row direction X is 280~290 μm, and a dimension in the column direction is 74~77 μm.

In some embodiments of the present disclosure, the photodiode B is configured to detect the luminous intensity of more than two pixel units A1, for example, as shown in FIG. 7, between two pixel units A1 adjacently disposed along the column direction Y, a dummy detection region B2 (without providing a photodiode) is disposed, while the dummy detection area B2 is disposed between two photo detection areas B1 adjacently disposed along the row direction X. The photodiodes of the two photodetection regions B1 adjacent to the dummy detection region B2, i.e., the photodiode 5 of the left neighboring photodetection region B1 or the photodiode 5 of the right neighboring photodetection region B1, are configured to detect the luminous intensity of the two pixel units adjacent to the dummy detection region B2 in the column direction Y.

In some embodiments of the present disclosure, the photodiodes 5 may be further configured to detect ambient light intensity of the display substrate surface, and thus, the photodiodes B may be further configured to perform optical fingerprint detection.

Figure 8:
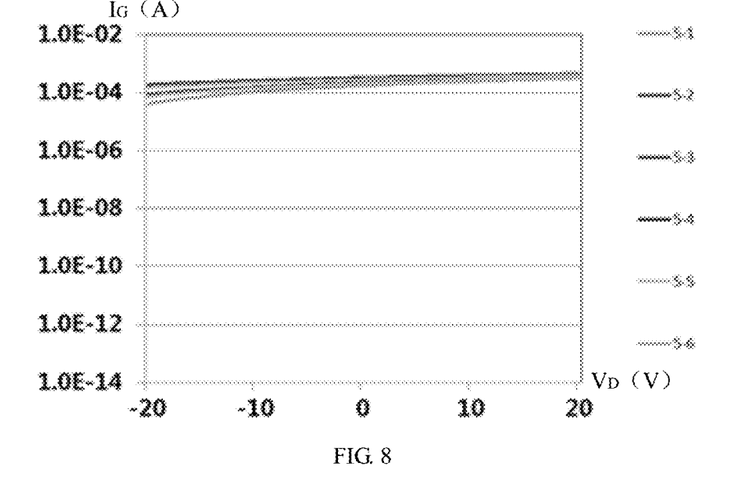
FIG. 8 is a characteristic graph of a third thin film transistor of the display substrate shown in FIG. 1.
Figure 9:
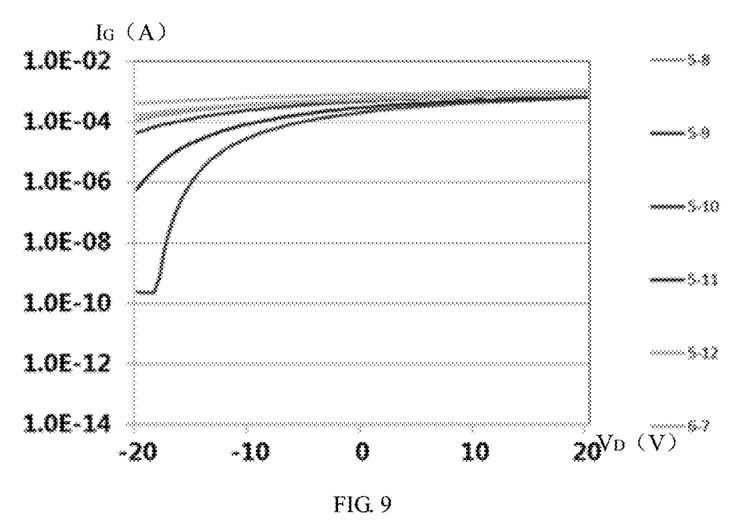
FIG. 9 is a characteristic graph of a first thin film transistor of the display substrate shown in FIG. 1.
Figure 10:
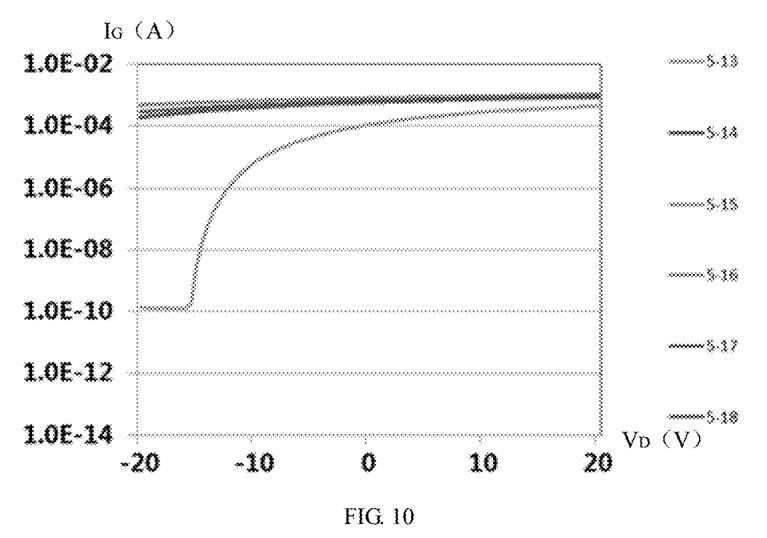
FIG. 10 is a characteristic graph of a second thin film transistor of the display substrate shown in FIG. 1.

FIGS. 8 to 10 show characteristic curves of each thin film transistor of the display substrate shown in FIG. 1, in which the abscissa is source-drain voltages $V_D$ (unit: V), and the ordinate is gate currents $I_G$ (unit: A), 1.0E−02 represents $1*10^{-2}$, 1.0E−03 represents $1*10^{-3}$, and so on. Different lines (e.g., 5.1, 5.2, 5.3, etc.) represent characteristics curves of thin film transistors tested on the same glass for different display substrates. As can be seen from the figures, after the photodiodes are formed, the first thin film transistor T1, the second thin film transistor T2, and the third thin film transistor T3 each show significant conduction, and thus large currents are generated, which affects the performances of the thin film transistors, such that the thin film transistors remain in a turn-on state.

Figure 11:
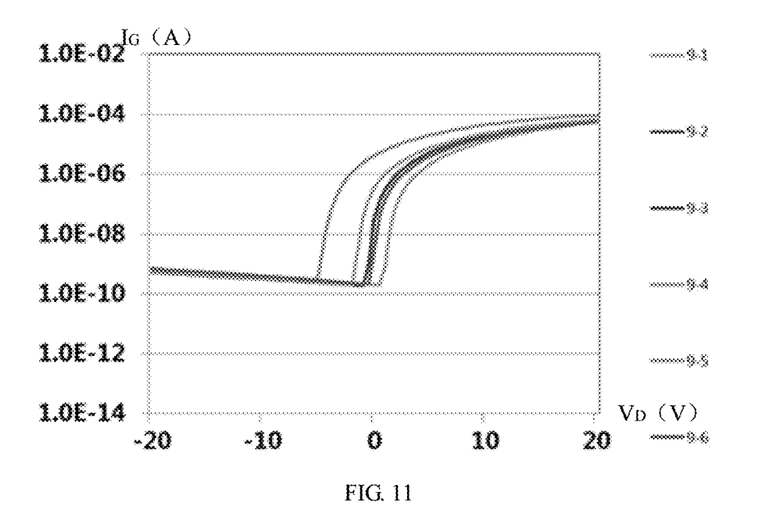
FIG. 11 is a characteristic graph of a third thin film transistor of the display substrate shown in FIG. 3.
Figure 12:
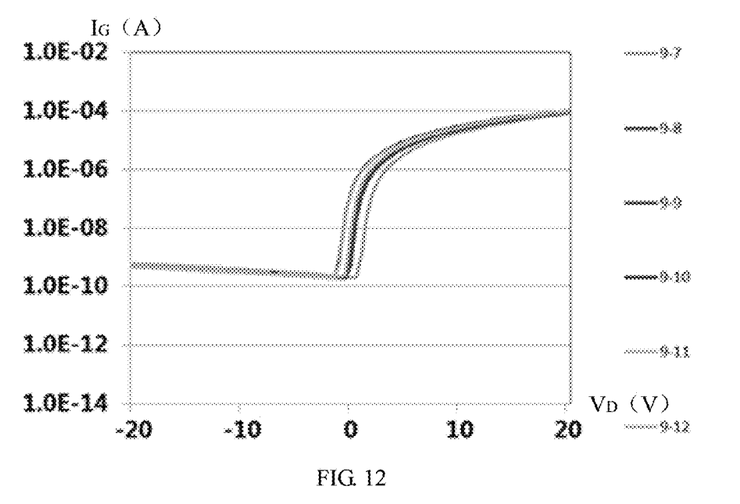
FIG. 12 is a characteristic graph of a first thin film transistor of the display substrate shown in FIG. 3.
Figure 13:
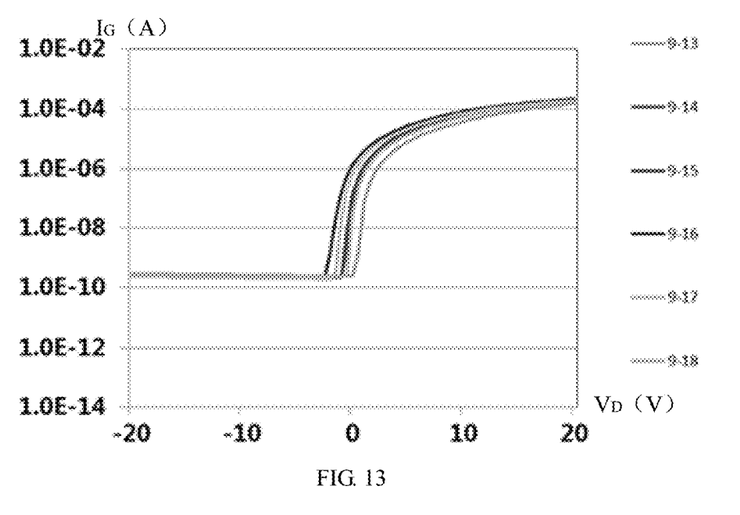
FIG. 13 is a characteristic graph of a second thin film transistor of the display substrate shown in FIG. 3.

FIGS. 11 to 13 show characteristic curves of each thin film transistor of the display substrate shown in FIG. 3, in which the abscissa is source-drain voltages $V_D$ (unit: V), and the ordinate is gate currents $I_G$ (unit: A), 1.0E−02 represents $1*10^{-2}$, 1.0E−03 represents $1*10^{-3}$, and so on. Different lines (e.g., 5.8, 5.9, 5.10, etc.) represent characteristic curves of thin film transistors tested on the same glass for different display substrates. As can be seen, after the photodiodes are formed, the first thin film transistor T1, the second thin film transistor T2 and the third thin film transistor T3 each do not show conduction (areas with larger $I_G$ correspond to the gate current of the thin film transistors in normal operation), thereby improving performances of the thin film transistors.

At least one embodiment of the present disclosure further provides a display panel including the display substrate of any one of the preceding embodiments. Of course, the display panel also includes an encapsulation layer for encapsulating the display substrate, preventing ingress of water and oxygen and thus preventing the device failure.

At least one embodiment of the present disclosure further provides a display device including the display substrate of any one of the preceding embodiments. The display device may be, for example, a mobile phone, a tablet, a display, a television, a conference tablet or other devices having a display screen. Of course, the display device also includes one or more housings, one or more processing systems, one or more power systems, one or more communication systems, and the like.

The present disclosure further provides a method for manufacturing a display substrate. The manufacturing method includes:

providing a base substrate 1;

forming a metal light-shielding layer 2 on the base substrate;

forming a plurality of first thin film transistors T1 and a plurality of second thin film transistors T2 on the metal light-shielding layer 2, output terminals of the first thin film transistors T1 being electrically connected to the metal light-shielding layer 2;

forming a plurality of photodiodes 5 on the second thin film transistors T2; and forming an insulating cover layer on the photodiodes.

The term "on" of "forming the metal light-shielding layer 2 on the base substrate" simply means the relative positional relationship of the metal light-shielding layer 2 and the base substrate 1, and does not specifically mean whether they are adjacent or spaced apart.

The output terminal S2 of the second thin film transistor T2 is electrically connected to the sense signal line Sense_O to transmit the photocurrent received from the photodiode to the chip through the sense signal line Sense_O.

The photodiode 5 includes a first electrode 51 electrically connected to the gate G1 of the first thin film transistor T1, a second electrode 53 electrically connected to an input terminal of the second thin film transistor T2, and a photosensitive layer 52 disposed between the first electrode 51 and the second electrode 53.

In some embodiments of the present disclosure, the method further includes performing an annealing process on the insulating cover layer.

The annealing process may replenish the first thin film transistor T1, the second thin film transistor T2, and the third thin film transistor T3 with oxygen, which may combine with hydrogen entering the thin film transistors when forming the photosensitive layer 52, to form water vapor and overflow, thereby reducing the influence of hydrogen on each thin film transistor.

In some embodiments of the present disclosure, the method further includes forming a plurality of pixel electrodes on the insulating cover layer, the pixel electrodes being electrically connected to the output terminals of the first thin film transistors.

In some embodiments of the present disclosure, the photodiode includes a first electrode electrically connected to the gate of the first thin film transistor, a second electrode electrically connected to the second thin film transistor, and a photosensitive layer disposed between the first and second electrodes.

Of course, the method for manufacturing the display substrate further includes forming other insulating layers, bridge electrodes, organic light emitting layers, common electrodes, and the like.

The above is only an exemplary embodiment of the present disclosure and does not limit the present disclosure in any form. Although the present disclosure has been disclosed as above in a preferred embodiment, it is not used to limit the present disclosure. Those skilled in the art can make some changes or modifications to the equivalent embodiment of equivalent changes by using the technical content disclosed above without departing from the scope of solutions of the present disclosure. However, any simple amendments, equivalent changes and modification made to the above embodiments according to the technical essence of the disclosure without departing from the content of the solutions of the disclosure still falls within the scope of the solutions of the disclosure.

The invention claimed is:

1. A display substrate, comprising:
a base substrate;
a metal light-shielding layer disposed on the base substrate;
a plurality of pixel units disposed on the base substrate;
a plurality of first thin film transistors disposed on the metal light-shielding layer and configured to drive the pixel units;
a plurality of photodiodes disposed on the metal light-shielding layer and configured to convert light emitted from the pixel units into photocurrents; and
a plurality of second thin film transistors disposed on the metal light-shielding layer and configured to receive the photocurrents so that light emission of the pixel units are compensated according to the photocurrents;
wherein output terminals of the first thin film transistors are electrically connected to the metal light-shielding layer.

2. The display substrate according to claim 1, wherein the first thin film transistors and the second thin film transistors are disposed in a same layer and are all top gate structures, and the photodiodes are located above the second thin film transistors.

3. The display substrate according to claim 1, wherein the photodiodes are located over the first thin film transistors and the second thin film transistors, and each comprises a first electrode, a second electrode, and a photosensitive layer disposed between the first electrode and the second electrode, the first electrode is electrically connected to gates of one or more of the first thin film transistors and the second electrode is electrically connected to one or more of the second thin film transistors.

4. The display substrate according to claim 1, wherein the display substrate comprises a plurality of the pixel units disposed along a column direction and a plurality of pixel circuit regions disposed along the column direction, each of the pixel units is located between a corresponding pixel circuit region and a corresponding photodiode, and the first thin film transistors are at least partially located in the pixel circuit regions.

5. The display substrate according to claim 1, wherein the display substrate comprises a plurality of the pixel units disposed along a column direction, each of the photodiodes is located between two adjacent pixel units of the pixel units, and is configured to detect a luminous intensity of the two adjacent pixel units.

6. The display substrate according to claim 5, wherein the display substrate comprises one or more dummy detection areas each located between two photodiodes adjacently disposed along a row direction.

7. The display substrate according to claim 1, wherein each of the pixel units comprises a plurality of sub-pixel units, each of the plurality of sub-pixel units emitting light with a color different from that of others of the plurality of sub-pixel units.

8. The display substrate according to claim 3, further comprising a detection signal line, a plurality of data signal lines and a plurality of third thin film transistors, wherein the data signal lines are respectively electrically connected to an input terminal of a corresponding one of the third thin film transistors, and for each of the first thin film transistors, a gate of the first thin film transistor is electrically connected to an output terminal of a corresponding third thin film transistor; and
the detection signal line is electrically connected to output terminals of the second thin film transistors, and the second electrode is electrically connected to input terminals of the plurality of second thin film transistors.

9. The display substrate according to claim 8, wherein the detection signal line and the data signal lines are arranged along a column direction, and the pixel units are at least partially located between the detection signal line and the data signal lines.

10. A display panel comprising the display substrate according to claim 1.

11. A method for manufacturing a display substrate, comprising:
providing a base substrate;
forming a metal light-shielding layer on the base substrate;
forming a plurality of first thin film transistors and a plurality of second thin film transistors on the metal light-shielding layer, output terminals of the first thin film transistors being electrically connected to the metal light-shielding layer;
forming a plurality of photodiode on the second thin film transistors;
forming an insulating cover layer over the photodiodes; and
forming a plurality of pixel units disposed on the insulating cover layer,
wherein the plurality of first thin film transistors are configured to drive the pixel units, the plurality of photodiodes are configured to convert light emitted from the pixel units into photocurrents, and the plurality of second thin film transistors are configured to receive the photocurrents.

12. The method according to claim 11, wherein before forming the plurality of pixel units disposed on the insulating cover layer, the method further comprises: annealing the insulating cover layer.

13. The method according to claim 11, wherein forming the plurality of pixel units disposed on the insulating cover layer comprises: forming a plurality of pixel electrodes on the insulating cover layer, the pixel electrodes being electrically connected to the output terminals of the first thin film transistors.

14. The method according to claim 11, wherein the photodiodes each comprise a first electrode, a second electrode and a photosensitive layer disposed between the first and second electrodes, the first electrode is electrically connected to gates of one or more of the first thin film transistors and the second electrode is electrically connected to one or more of the second thin film transistors to transmit a photocurrent generated by the photodiode to the plurality of second thin film transistors.

* * * * *